United States Patent [19]
Degani et al.

[11] Patent Number: 5,646,828
[45] Date of Patent: Jul. 8, 1997

[54] THIN PACKAGING OF MULTI-CHIP MODULES WITH ENHANCED THERMAL/POWER MANAGEMENT

[75] Inventors: Yinon Degani, Highland Park; Thomas Dixon Dudderar, Chatham; Byung Joon Han, Scotch Plains; Alan Michael Lyons, New Providence, all of N.J.

[73] Assignee: Lucent Technologies Inc., Murray Hill, N.J.

[21] Appl. No.: 697,121

[22] Filed: Aug. 20, 1996

Related U.S. Application Data

[62] Division of Ser. No. 392,640, Feb. 24, 1995, abandoned.
[51] Int. Cl.$^6$ .................................................. H05K 7/20
[52] U.S. Cl. ................ 361/715; 257/707; 257/713; 257/738; 257/778; 257/787; 361/717; 361/722; 361/761; 361/744; 361/803
[58] Field of Search .................... 257/678, 686–687, 257/690, 704, 706–707, 713, 723–724, 737–738, 777–778, 787; 361/704, 707, 709, 714–722, 761–765, 744, 790, 792–795, 803; 439/70–72

[56] References Cited

U.S. PATENT DOCUMENTS

| | | | |
|---|---|---|---|
| 4,539,622 | 9/1985 | Akasaki | 361/401 |
| 4,630,172 | 12/1986 | Stenerson et al. | 361/761 |
| 5,001,548 | 3/1991 | Iversen . | |
| 5,008,734 | 4/1991 | Dutta et al. | 257/707 |
| 5,012,386 | 4/1991 | McShane et al. | 361/715 |
| 5,043,796 | 8/1991 | Tai et al. | 257/686 |

(List continued on next page.)

FOREIGN PATENT DOCUMENTS

| | | | |
|---|---|---|---|
| 60-10764 | 1/1985 | Japan | 361/761 |
| 4209558 | 7/1992 | Japan | 257/678 |
| 5048000 | 2/1993 | Japan | 257/686 |

OTHER PUBLICATIONS

"Overmoled Plastic Array Carriers (OMPAC): A Low Cost, High Interconnect Density IC Packaging Solution for Consumer and Industrial Electronics" by Bruce Freyman and Robert Pennisi, Journal: 41st Electronic Components and Technology Conference, Book B, No. 502920, Atlanta, GA., pp. 176–182.

"A Mixed Solder Grid Array and Peripheral Leaded MCM Package" by Hashemi, H., Olla, M., Cobb, D., and Sandborn, P., Journal: Proc Electron Compon Technol Conf., Orlando, Florida 1993, pp. 951–956.

*Primary Examiner*—Gregory D. Thompson

[57] ABSTRACT

A novel packaging of semiconductor elements, such as MCM tiles, with a variety of printed circuit or wired boards (PWB), the packages occupying a small size, at least in the vertical direction, relative to prior art OMPAC devices. The MCM tile includes an interconnection substrate with peripheral metallizations and at least one chip or integrated circuit (IC) mounted on the substrate by solder reflow or conductive adhesive technology. The PWB which may be a single level or a multilevel, is provided with an aperture for accommodation of at least one chip therein. Depending on the type of interconnection between the substrate and the PWB, the aperture may be larger than the substrate of the MCM tile for wire bonding interconnection or smaller than the substrate for solder reflow or conductive adhesive interconnection. In the wire bonding case, the MCM tile is positioned within the aperture resting on the surface of the PWB or of a structural member or of a heat sink which encloses one end of the aperture. The other end of the aperture may be open or enclosed by a structural member, a heat sink, another PWB or a mother board. For solder reflow or conductive adhesive interconnection, the substrate which is larger than the aperture is positioned so that its ends overlap areas of the PWB adjacent the aperture and the chips and/or substrate are positioned within the aperture. The interconnections are enclosed in a compliable encapsulating material, such as silica gel.

5 Claims, 4 Drawing Sheets

U.S. PATENT DOCUMENTS

| | | |
|---|---|---|
| 5,109,317 | 4/1992 | Miyamoto et al. . |
| 5,276,586 | 1/1994 | Hatsuda et al. . |
| 5,323,292 | 6/1994 | Brzezinski . |
| 5,346,118 | 9/1994 | Degani et al. . |
| 5,355,283 | 10/1994 | Marrs et al. .............................. 361/761 |
| 5,521,435 | 5/1996 | Mizukoshi ................................ 257/738 |
| 5,541,450 | 7/1996 | Jones et al. .............................. 257/738 |
| 5,561,323 | 10/1996 | Andros et al. ........................... 361/720 |

5,646,828

THIN PACKAGING OF MULTI-CHIP MODULES WITH ENHANCED THERMAL/ POWER MANAGEMENT

This application is a division of application Ser. No. 08/392,640, filed on Feb. 24, 1995, now abandoned.

TECHNICAL FIELD

This invention concerns packaging of semiconductor devices with integrated circuit units to be applied to surface mount assembly.

BACKGROUND OF THE INVENTION

Portable industrial and consumer products tend toward smaller size, lower cost and increased functionality. These requirements place greater emphasis on the development of semiconductor packaging technologies which can accommodate larger, more complex integrated circuits in smaller packages capable of handling greater power densities.

Conventional surface mount technology utilizes leaded plastic packages. However, as the pitch and size of the leaded plastic packages keep on being reduced, such problems as poor solder assembly yields, due to poor control of lead coplanarity, and poor fine pitch solder printing yields, due to continuing shrinking of the lead pitch, continue to remain of major importance.

One type of packaging which seemed to overcome these problems is an Overmolded Plastic Pad Array Carrier (OMPAC) technology. OMPAC assembly utilizes a double-sided printed circuit or wiring board laminate. (Hereinafter the printed circuit board or printed wiring board will be referred to as "PWB"). The top side metallization of the PWB is comprised of a die pad for die attachment of an integrated circuit unit and grounding and wire bond fingers. The integrated circuit unit may include a semiconductor chip (a die), or multiple semiconductor chips, or a Multi-Chip Module (MCM) tile including at least one chip flip-chip mounted on a silicon substrate. The wire bond fingers extend outward to plated through holes (hereinafter referred to as "thruholes") in the PWB located near the edge of the package. The thruholes provide an electrical continuity from the top side to the bottom side of the PWB. The signal path is completed on the bottom side of the PWB by plated copper traces extending from the thruholes to solder pads for solder bump termination. Except for the solder bumps, all metal features on the PWB are photodefined, etched and electroplated with copper, nickel and gold. Conventional epoxy die attach and wire bonding technologies are used to interconnect the integrated circuit unit to the PWB. After the die and wire bonding, the PWB is overmolded using conventional epoxy transfer technology. After post-mold curing, the packages are solder bumped and electrically tested. Subsequently these are referred to as "ball grid array" (BGA) packages. Solder bumps are used for further interconnection of the BGA package, for example, to a "mother board". The mother board typically has a much larger area than the OMPAC BGA package, upon which may be arranged a number of other interconnected electrical elements, such as capacitors, transformers, and resistors, which cannot be conveniently integrated into the chips or modules, as well as other packaged IC's, BGAs, plugs and connectors.

The major advantages of OMPAC BGA packages as compared to leaded surface mount packages include increased packaging interconnect density due to an evenly spaced matrix of solder connections on the bottom side of the package, higher solder assembly yields, and no lead coplanarity problems.

However, it is desirable to reduce the thickness of the packages. Furthermore, it would be desirable to provide for efficient removal of heat from the IC unit.

SUMMARY OF THE INVENTION

This invention embodies a novel packaging of semiconductor elements, such as MCM tiles, with a variety of printed circuit or wired boards (PWB), the packages occupying smaller size than prior art OMPAC devices, at least in the vertical dimension. The MCM tile includes an interconnection substrate with peripheral metallizations and at least one chip or integrated circuit (IC) mounted on the substrate by solder reflow technology or by conductive adhesive technology. The PWB, which may be a single level or a multilevel, is provided with an aperture for accommodation of at least one chip of the MCM tile therein. Depending on the type of interconnection between the substrate and the PWB, the aperture may be larger than the substrate of the MCM tile for wire bonding interconnection, or smaller than the substrate for solder reflow or conductive adhesive interconnection. In the wire bonding case, the MCM tile is positioned within the aperture resting on the surface of either the PWB or a structural member or a heat sink which encloses one end of the aperture. The other end of the aperture may be open or enclosed by a structural member, a heat sink, another PWB or a mother board. For solder reflow or adhesive interconnections, the aperture is smaller than the substrate which is positioned so that its end regions overlap areas of the PWB adjacent the aperture and the chips and/or the substrate are positioned within the aperture. The interconnections are encapsulated in a highly compliable encapsulating material, such as silica gel.

DETAILED DESCRIPTION

Figure 1:
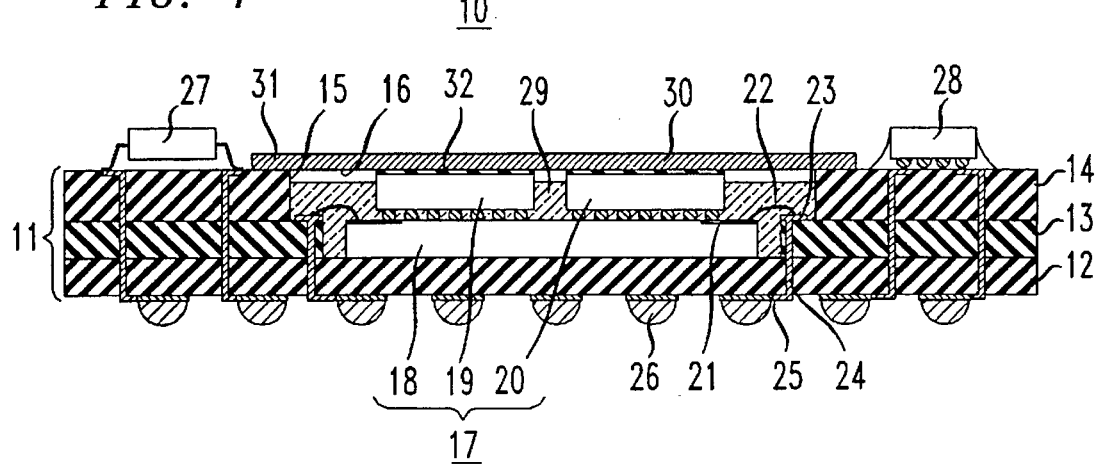
FIG. 1 is a schematic representation in cross-section of a semiconductor device having an MCM tile mounted on a multilevel PWB having a stepped aperture, the MCM tile positioned within a cavity formed by the PWB, is electrically connected to the PWB by means of wire bonds, a structural member encloses the cavity and the cavity is filled with a compliant encapsulating material encompassing at least the chips of the MCM tile.

This invention embodies packaging of silicon-on-silicon Multi-Chip Module (MCM) tiles in packages which occupy smaller size, at least in the vertical direction, than prior art OMPAC devices, effectively protect the MCM tile, and are provided with a heat sink to remove the heat from the MCM tile. A typical MCM tile includes an interconnection substrate and at least one silicon chip or integrated circuit (IC) flip-chip fashion mounted on the substrate by solder reflow technology or by conductive adhesive technology. The substrate may be made from a variety of materials including silicon, ceramic and plastic laminate. Peripheral metallizations are provided on the substrate to permit interconnection of the MCM tile to PWB or a mother board.

Hereinbelow, are disclosed several variants of packaging the MCM tiles with PWBs. The packaging is accomplished in a much more compact, at least thinner, size than comparable prior art packages, e.g. In each variant disclosed hereinbelow, the PWB is provided with an aperture for forming a cavity in which the MCM tile is positioned such that after the cavity is filled with a compliant encapsulating material, the interconnections between the chips and the substrate and between the substrate and the PWB are protected from the environment. In order to facilitate efficient removal of thermal energy in combination with the low-profile packaging of devices with high power densities, the packages are provided with a structural member acting as a heat sink, which encloses the cavity providing additional protection to the MCM tile. The heat absorbed by the heat sink may be dissipated in a known manner, as is well known in the art. This could be accomplished by a fluid flow, e.g., air, passed over the heat sink. The heat removal may be further enhanced by placing a heat spreader, e.g., a finned heat spreader, in contact with the heat sink, which in turn may be fluid cooled.

This invention is concerned with achieving the smallest possible vertical dimension in combination with an optimally situated structural member which incorporates either thermal vias and/or functions as a heat sink. However, there are many applications where an inherently low power density does not require the use of either a heat sink or thermal vias. In such an application any of the designs of this invention may be realized with neither a heat sink nor thermal vias.

This may be accomplished either by (1) the complete elimination of subject heat sink member from the design or, if this member serves an additional structural function such as defining the encapsulation volume or supporting the MCM tile, (2) by the substitution, in subject structural member, of a low thermal conductivity material such as plastic (which is relatively cheap) for the high thermal conductivity metal (typically copper which is expensive) that would otherwise be used for a heat sink, etc. In this application the advantages of a thin package will be retained, and possibly enhanced, without incurring the costs of a fully realized heat sink structure.

In FIG. 1 of the drawings is shown a schematic representation of one variant of an MCM package, 10. A multi-level PWB, 11, includes a lower level, 12, a middle level, 13, and an upper level, 14. In this variant, lower level, 12, is continuous, while the middle and the upper levels are provided each with a through-aperture forming a stepped aperture, 15, which forms with lower level, 12, a cavity, 16. In an exemplary embodiment the MCM tile is a silicon-on-silicon MCM tile, 17, including a silicon substrate 18, and a plurality of silicon chips, 19 and 20, is positioned in the cavity. The silicon substrate rests within the cavity on the surface of the lower level of the PWB. Wirebond fingers, 21, on the silicon substrate are interconnected via wires, 22, to contact pads, 23, on the middle level of the PWB. These pads, in turn, are interconnected via thruholes, 24, to other levels of the PWB, e.g., to contacts, 25, and thus, to solder bumps, 26, on the bottom of the lower level, or, optionally, to other chips or electronic devices, such as 27 and 28, on the surface of the upper level of the PWB. In this figure and in the remaining figures, for simplicity, only a few of the contacts and thruholes are shown; however, it is well known in the art how these are arranged on the PWBs. The MCM tile which rests on the surface of the lower level is completely within cavity 16, the upper surface of the chips being below the upper surface of the upper level of the PWB.

Cavity 16 is filled with a highly compliant encapsulating material, 29, such as silicon gel. The encapsulant encloses the interconnections between the chips and the silicon substrate, wire bond fingers on the silicon substrate, contact pads on the PWB and wires interconnecting the wire bond fingers and the pads.

Device 10 is also provided with a structural member which acts as a heat sink, 30, which encloses the cavity. End portions, 31, of the heat sink rest on the upper level of the PWB. The heat sink is spaced from the chips of the MCM tile and yet is close enough to pick up the heat produced by the components of the MCM tile during an operation of the device. Optionally, a heat conducting compliant member, 32, such as a heat conductive paste or thermal grease, may be placed so that it will be in physical contact with the chips and the heat sink.

Figure 2:
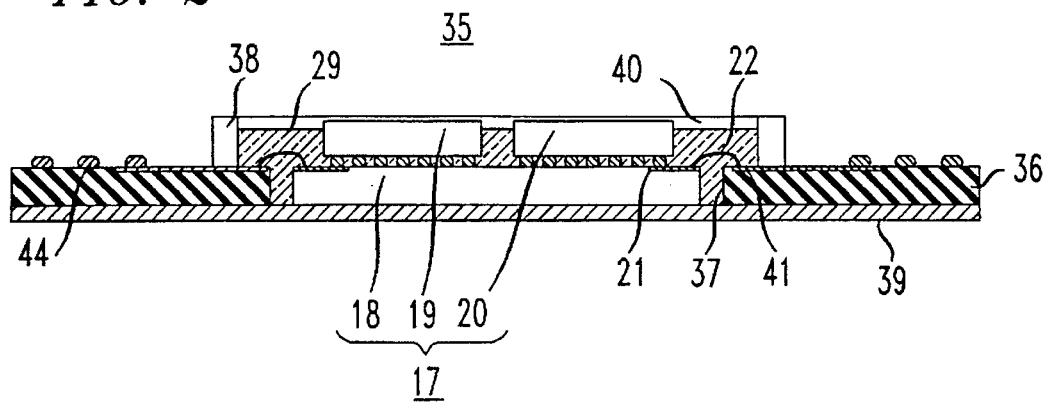
FIG. 2 is a schematic representation in cross-section of a semiconductor device in which a single level PWB is provided with a stepped through-aperture defined by the walls of the PWB and of a dam positioned on the PWB, a structural member is attached to the PWB enclosing one end of the aperture, the structural member, the walls of the aperture and the dam forming a cavity, the MCM tile rests within the cavity on the structural member, the MCM tile is electrically connected to the PWB by means of wire bonds, and the cavity is filled with the compliant encapsulating material encompassing the MCM tile.

In FIG. 2 of the drawings is shown a schematic representation in cross-section of another variant of an MCM package, 35. The silicon-on-silicon MCM tile is similar to MCM tile 17 described in FIG. 1; therefore, similar numerals will be used for the MCM tile in this figure and in FIGS. 3–10 that follow. A single level PWB, 36, is provided with a through-aperture, 37. A dam, 38, is positioned on an upper surface of the PWB, encircling the aperture. The dam is spaced away from the aperture to permit interconnection between the silicon substrate and the PWB. The dam functions as a retainer for compliant encapsulating material to be encompassing the MCM tile. A structural member, 39, is secured to the bottom of the PWB. The structural member is a rigid plate which may be utilized only for enclosing one end of the aperture or it may also be used as a heat sink. For the former purpose the structural member may be of a plastic material, while for the heat sink it could be of metal or some other material having high heat-conducting characteristics. The structural member, the walls of the aperture and the dam form a cavity, 40. MCM tile 17 is within the cavity with silicon substrate 18 of the MCM tile resting on and in contact with the structural member. Wire bond fingers 21 on the silicon substrate are connected by wires 22 to contact pads, 41, on the PWB. The MCM tile and the wire interconnections are encapsulated in compliant encapsulating material, such as silicon gel, 29. As in FIG. 1, the silicon gel encompasses the interconnections between the substrate and the chips and the substrate and the PWB, protecting them against the environment.

Figure 3:
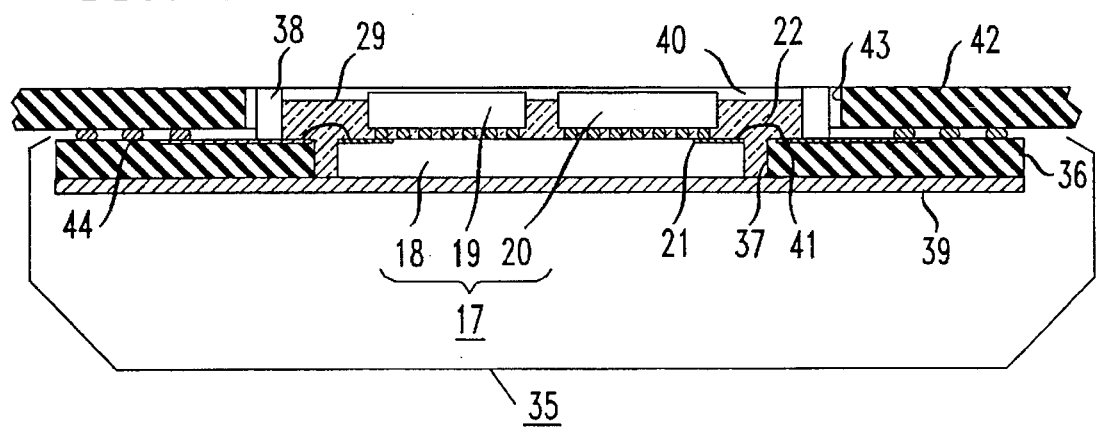
FIG. 3 is a schematic representation of the semiconductor device shown in FIG. 2 in which a mother board is electrically connected to the PWB.

In FIG. 3 of the drawings is shown device 35 electrically and mechanically interconnected to a mother board, 42. The mother board has an aperture, 43, large enough to encompass dam 38. The mother board overlies the PWB and is electrically connected by means of solder or conductive adhesive interconnections, 44, to the PWB.

Figure 4:
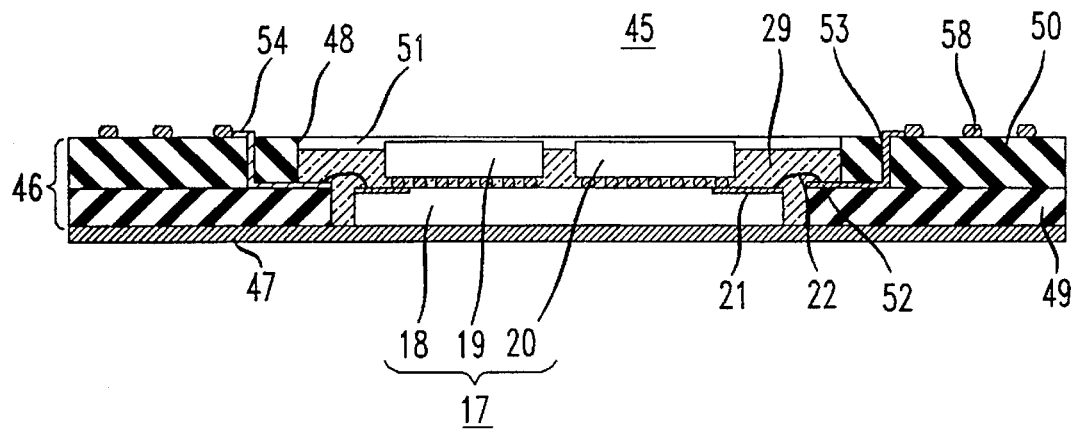
FIG. 4 is a schematic representation in cross-section of a semiconductor device in which a bi-level PWB is provided with a stepped through-aperture, a structural member is attached to the PWB enclosing one end of the aperture, the structural member and the walls of the aperture forming a cavity, the MCM tile rests within the cavity on the structural member, the MCM tile is electrically connected to the PWB by means of wire bonds, and the cavity is filled with the compliant encapsulating material encompassing the MCM tile.

In FIG. 4 of the drawings is shown a schematic representation in cross-section of yet another variant of an MCM package, 45. The MCM package includes MCM tile 17, a hi-level PWB, 46, and a structural member, 47, acting as a heat sink. The PWB is provided with a stepped through-aperture, 48, passing through both a lower level, 49, and an upper level, 50, of the PWB. Lower level 49, of the PWB rests on the structural meaner which encloses one end of aperture 48 forming a cavity, 51. The MCM tile is positioned within cavity 51, formed by the structural member and the walls of the stepped aperture, with silicon substrate 18 of the MCM tile resting on the structural member. Wires 22 interconnect wirebond fingers 21 on the silicon substrate to contact pads, 52, on the lower level of the PWB. Contact pads, 52, in turn, are interconnected via thruholes, 53, to contact pads, 54, on upper level 51 of ate PWB for future connection to another PWB or a mother board. Additionally, the MCM tile and the wire interconnections are encapsulated in silicon gel 29.

Figure 5:
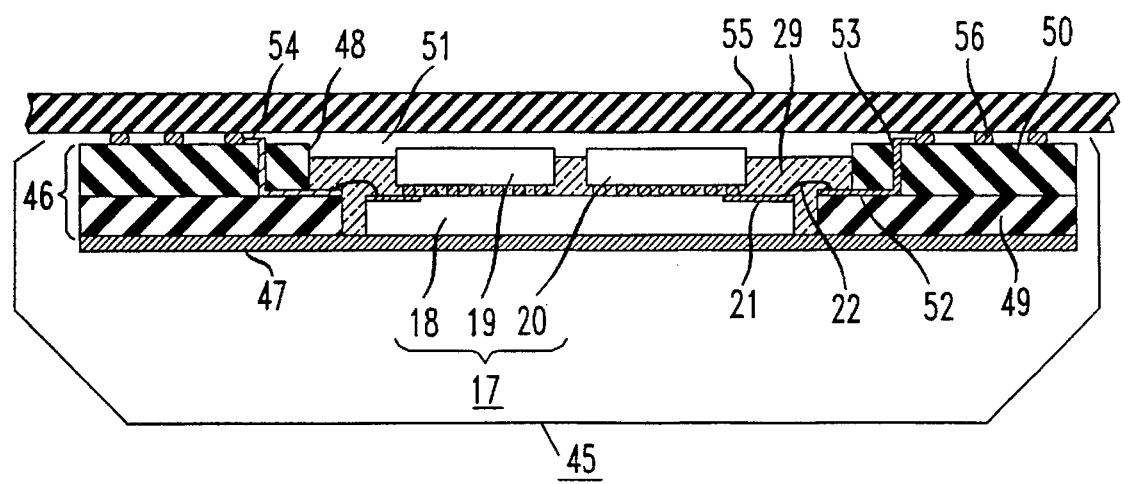
FIG. 5 is a schematic representation of the semiconductor device shown in FIG. 4 in which a mother board, electrically connected to the PWB, is positioned above the MCM tile enclosing the cavity.

In FIG. 5 of the drawings is shown device 45, electrically and mechanically interconnected to another board, such as a mother board, 55. Mother board 55 overlies the upper level of the bi-level PWB enclosing cavity, 51. Mother board 55 is connected to PWB 46 by means of solder reflow interconnections, 56.

In FIGS. 1–5 of the drawings were described MCM package variants in which wire bond fingers on the silicon substrate of the MCM tile are interconnected to contact pads on the PWB by means of wires. In order to provide viable interconnections, the wire-bond fingers made of wire bondable metal such as aluminum, and the related pads on the PWB must have a wire bondable surface finish such as gold-over-nickel plated copper. By eliminating the wire bonding interconnection, the need for expensive gold-over-nickel plating of copper on the PWB would also be eliminated. MCM packages described in FIGS. 6–10 are produced without wire bonding between the silicon substrate and the PWB. Here, the bonding may be provided by solder reflow or by conductive adhesive interconnection technology. For soldering the PWB is provided, in a known manner, with a pattern of contact pads which match I/O pads on the MCM tile. In order to provide a proper surface for reflow solder, each of these contact pads is finished in a known manner with a solder wettable metallization. This interconnection removes the necessity for wire bond connecting the circuitry on the silicon substrate to the circuitry on the PWB.

In order to accommodate the use of printed solder as an interconnection medium between the MCM tile and the PWB, wirebond fingers 21 on MCM tile substrates, e.g. or in any one of FIGS. 1–5, were replaced by solder wettable base I/O metal pads which were deposited at the same time as the interconnect flip-chip MCM pads. In an exemplary embodiment, these solder wettable I/O pads could be configured as 96 µm by 146 µm pads on a 305 µm (12 mil) pitch to facilitate printing with 170 µm by 280 µm solder paste deposits at the same time the solder paste is being printed on internal I/O pads used to attach the chips to the substrate. This process may be used with an intermediate to high melting point temperature solder, such as 95/5 Sn/Sb, to produce solder-bumped MCM tiles on which, after whole wafer assembly, cleaning, testing and separation into individual tiles, each output pad on every tile would be furnished with a solder bump. As such they would be suitable for reflow soldering with printed eutectic (or near eutectic) Sn/Pb solder paste common to standard Surface Mount Technology (SMT) assembly. Incidentally, the addition of solder bumps to the I/O pads of the MCM tile would also improve testability, and hence yields (as it does whenever solder bumped dies are tested electrically) by reducing the number of good tiles that are rejected due to false readings. A technology for forming solder bumps on metal pads of an element, such as on an IC package, substrate or PWB, is disclosed in U.S. Pat. No. 5,346,118 issued Sep. 13, 1994, which is incorporated herein by reference. That technology is very useful in manufacturing devices without wire bond interconnections.

Figure 6:
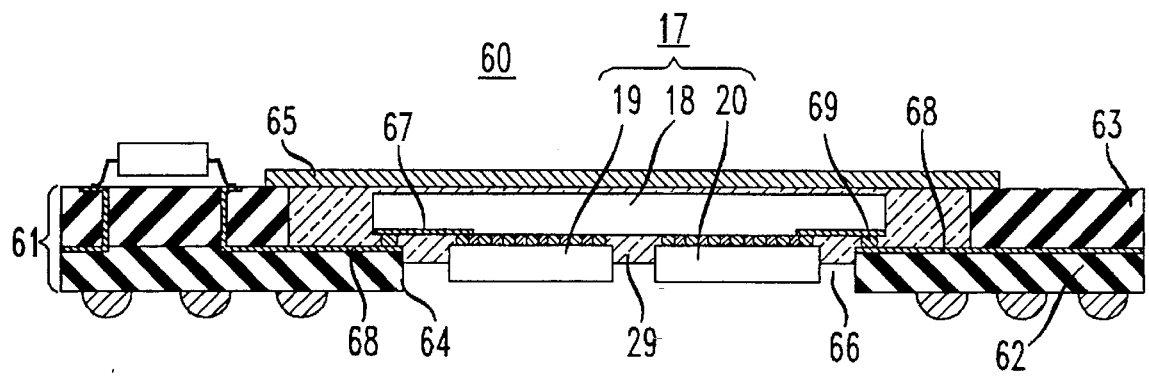
FIG. 6 is a schematic representation in cross-section of a semiconductor device in which a bi-level PWB is provided with a stepped through-aperture, an MCM tile is mounted within a cavity formed by the stepped walls of the aperture, the MCM tile is electrically connected to a lower level of the PWB by solder reflow or conductive adhesive interconnections, the cavity is filled with the compliant encapsulating material encompassing the MCM tile, and a structural member is placed on the PWB above the substrate of the MCM tile enclosing the cavity on the substrate side.

In FIG. 6 of the drawings is shown a schematic representation of an MCM package, 60, in which an MCM tile is interconnected to a PWB by means of solder bonding. The MCM package includes a hi-level PWB, 61, having a lower level, 62, and an upper level, 63. The PWB is provided with a stepped through-aperture, 64, which is open on the bottom of the lower level of the PWB. The size of aperture 64 is such that, when silicon substrate of the MCM tile is electrically interconnected to the PWB, ends of the silicon substrate overlay regions of the PWB adjacent to the aperture in the lower level of the PWB while chips on the silicon substrate face downward and fit into the aperture in the lower level without contacting the walls of the aperture. MCM tile 18 is positioned such that an upper surface of silicon substrate 18 of the MCM tile faces upwardly while chips 20 and 21 face downwardly through the aperture in the lower level and, yet, the chips are recessed within the aperture relative to the bottom surface of the lower level of the PWB. Device 60, is also provided with a structural member, 65, placed adjacent to the silicon substrate. The structural member, which encloses one end of aperture 64, defines together with walls of aperture, 64, a cavity, 66. The structural member, made of a high heat-conducting material, is being used as a heat-sink for the MCM tile. Bond fingers, 67, on the silicon substrate are electrically connected to contacts, 68, on the PWB, by means of solder reflow interconnections, 69. The cavity is filled with silicon gel 29 protectively enclosing interconnections between the chips and the silicon substrate and between the bond fingers on the silicon substrate and the contacts on the PWB. Since only the ends of the silicon MCM tile substrate are in contact with the circuitry on the PWB via solder interconnections and the chips are within the aperture, the thickness of the assembly is reduced, to the thickness of the PWB. This compares favorably to the MCM tile-on-PWB assembly thickness that results with the MCM tile mounted on top of the PWB, oriented with the chips up, and wire bonded to the PWB circuitry as in the prior art exemplified by FIGS. 11 and 12.

Figure 7:
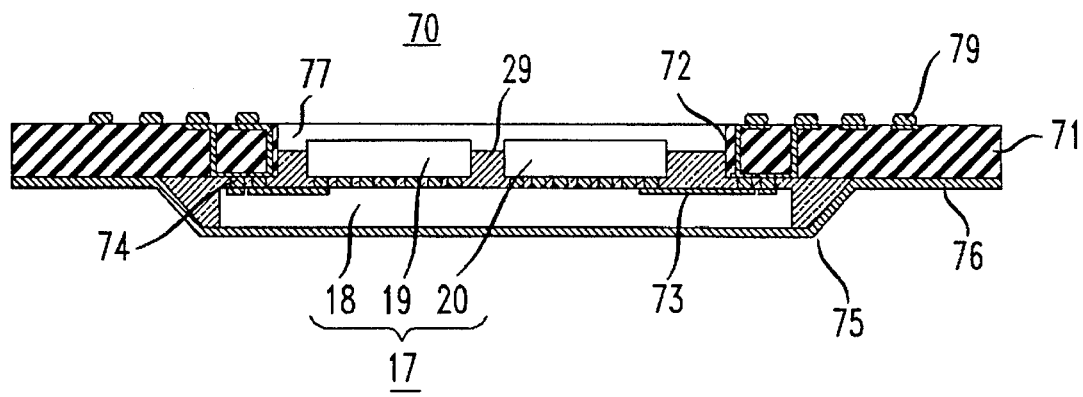
FIG. 7 is a schematic representation in cross-section of a semiconductor device in which a single level PWB is provided with a through-aperture, the substrate of an MCM tile is electrically interconnected to the bottom of the PWB by solder reflow or conductive adhesion interconnections while chips of the MCM tile are positioned within the aperture, a cup-like cover is placed over the MCM tile and in contact with the substrate, flange ends of the cover being in contact with the PWB, the cover and the walls of the PWB forming a cavity, and the cavity is filled with the compliant encapsulating material.

In FIG. 7 of the drawings is shown a schematic representation of another variant of an MCM package, 70, in which an MCM tile is interconnected to a PWB by means of solder reflow bonding. The MCM package includes a single level PWB, 71, provided with a through-aperture, 72. MCM tile 17 is positioned such that chips 19 and 20 of the MCM tile are positioned within aperture 72, while ends of silicon substrate 18 of the MCM tile overlap the bottom surface of the PWB adjacent to the aperture so that the silicon substrate lies outside of the aperture. Bond fingers, 73, on the silicon substrate are electrically connected by solder reflow to contacts, 74, on the PWB. A cup-like cover, 75, is in contact with the bottom surface of the silicon substrate, while end flanges, 76, of the cover are attached to the bottom of PWB by means of an adhesive (not shown). The cover may be of metal, such as copper or of plastic material having high heat-conducting characteristics for use as a heat sink for the MCM tile. A metal cover is advantageous because it can act as an electromagnetic radiation shield. A cavity, 77, formed by walls of aperture 72 and by the cover, is partially filled with a compliant encapsulating material, such as silicon gel 29, protectively enclosing the MCM tile and interconnections between the bond fingers and the contacts.

Figure 8:
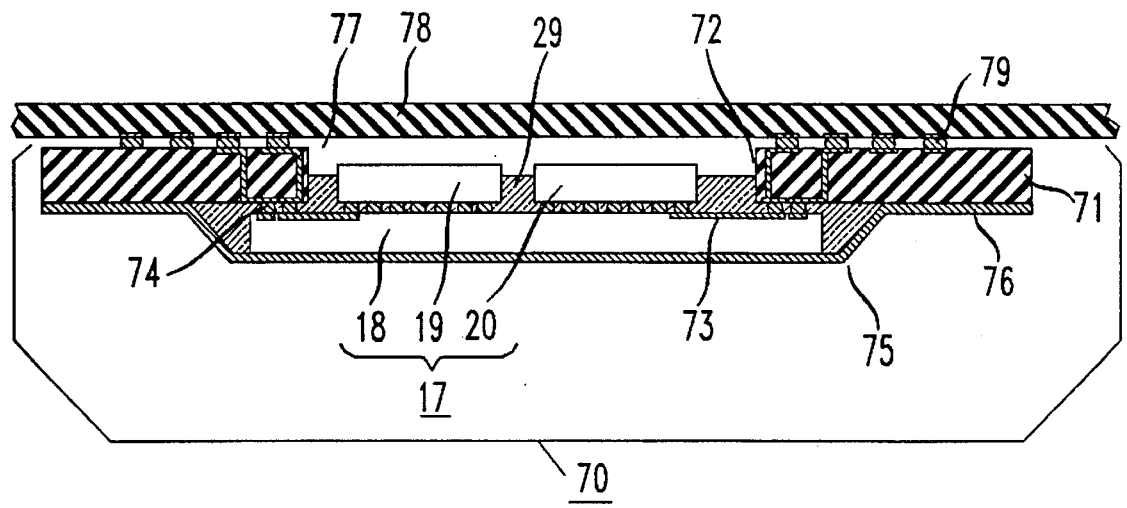
FIG. 8 is a schematic representation of the semiconductor device shown in FIG. 7 in which a mother board, electrically connected to the PWB on the side opposite to the cover, is positioned above the MCM tile enclosing the cavity.

In FIG. 8 of the drawings is shown device 70 electrically and mechanically connected to another board, such as a mother board, 78, which overlies cavity 77 on the upper side of the PWB. Mother Board 78 is electrically connected to the PWB by means of solder reflow interconnections, 79.

Figure 9:
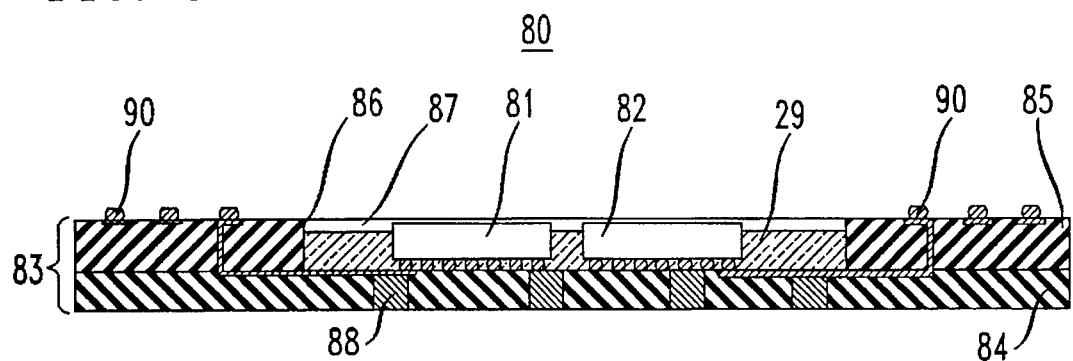
FIG. 9 is a schematic representation of a semiconductor device in which the PWB is a hi-level board with an aperture in the upper level of the PWB, the lower level and the walls of the upper level define a cavity, a plurality of heat-sink regions are positioned in and through the lower level of the PWB, a plurality of silicon chips positioned on the lower level of the PWB within the cavity are connected thermally to the heat-sink regions and electrically to the PWB by solder reflow or conductive adhesive interconnections, and the cavity is filled with the compliant encapsulating material.

In FIG. 9 of the drawings is shown a schematic representation of still another variant of a semiconductor package, 80, in which interconnection between an active semiconductor element and a PWB is provided by means of solder reflow. In this variant, however, instead of an MCM tile, a single or a plurality of individual chips, e.g., 81 and 82, are solder reflow interconnected to a hi-level PWB, 83, having a lower level, 84, and an upper level, 85. An aperture, 86, is formed in the upper level of the PWB. The chips are located in a cavity, 87, formed by the lower level of the PWB and the walls of the aperture 86. A plurality of heat sink inserts, 88, (also known as thermal vias) is provided in the lower level of the PWB to remove the heat away from the chips. The cavity is filled with a compliant encapsulating material, such as silicon gel 29, protectively enclosing the interconnections between the chips and the PWB.

Figure 10:
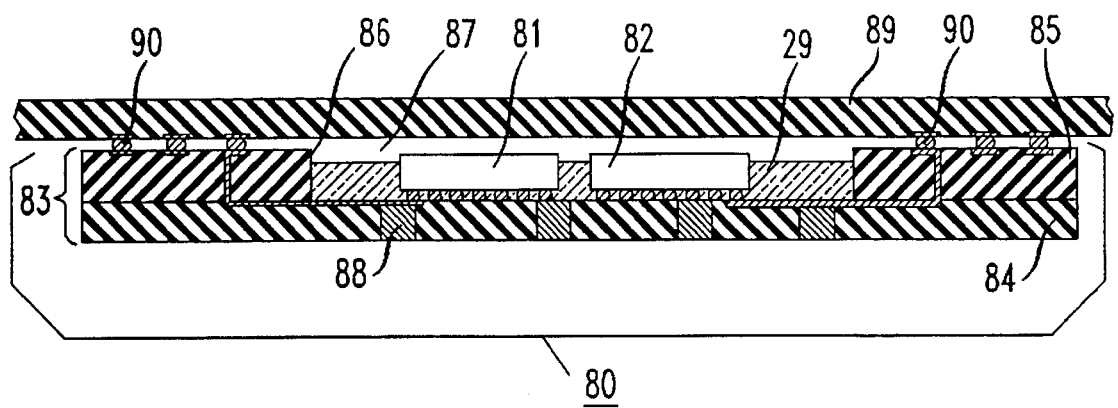
FIG. 10 is a schematic representation of the semiconductor device shown in FIG. 9 in which a mother board is electrically connected to the upper level of the PWB enclosing the cavity.

In FIG. 10 of the drawings is shown device 80 electrically and mechanically connected to a mother board or some other PWB, 89, which overlies the upper level of the PWB, enclosing cavity 87. Mother board 89 is interconnected to PWB 83 by means of solder reflow interconnections, 90.

Finally, if the PWB is to be an intermediate interconnection or lead-frame board similar to the lead-frame PWB which is mounted to a mother-board (either a single-sided flexible PWB or a double-sided rigid PWB with PTHs), it would be patterned so as to mate with the mother-board through an I/O array of robustly solder printable bumped solder pads. Bumped solder pads are advantageous, but pads without solder bumps are not excluded from this invention. For example, use of the 60 mil OMPAC standard BGA pitch would easily allow for a perimeter array of two staggered (for easy routing, even on an inexpensive single-sided PWB) rows of 0.71 mm (28 mil) diameter solder pads totaling 108 I/O in a 25.4 mm by 25.4 mm package. This provides the room needed for both (1) as many as 108 I/O connections and (2) the opening for the tile, without altering the shape or size of either the MCM package or the area on the mother-board required for the next level interconnection. At the same time it will still permit robust printed solder BGA bumping and surface mount reflow solder attachment to the mother-board.

Additional advantages and modifications will readily occur to those skilled in the art. Therefore, the invention in its broader aspects is not limited to the specific detail, representative devices, and illustrated examples shown and described. Accordingly, various modifications may be made without departing from the spirit or scope of the general inventive concept as defined by the appended claims and their equivalents. Departures from the present embodiments may be made without departing from the spirit and scope of the present invention. For example, the structural member shown in several of the embodiments such as structural member 39 in FIGS. 2 and 3, 47 in FIGS. 4 and 5, or cup-like cover 75 in FIGS. 7 and 8, or structural member 30 in FIG. 1 and 65 in FIG. 6, does not necessarily have to be a heat sink, but may simply be a reinforcing or a support member. All of these structural members, when not acting as heat sinks, may be made of a non-heat conducting or low-heat conducting materials, such as plastic materials. In some instances, structural members 30 and 65 may be omitted entirely.

We claim:

1. A multi-chip module (MCM) package comprising:
   a. a first printed wiring board (PWB) provided with at least one aperture extending from the top surface of said first PWB through the thickness of said first PWB to the bottom surface of said first PWB,
   b. a structural member attached to the bottom surface of said first PWB and covering said at least one aperture,
   c. a pattern of electrical conductors on the top surface of said first PWB,
   d. a multi-chip module tile positioned within said aperture with part of the multi-chip module tile contained within the aperture and part of the multi-chip module tile extending above the top surface of the first PWB, said multi-chip module further being attached to said structural member, said multi-chip module tile comprising a substrate with electrical conductors thereon, at least one silicon chip mounted on the substrate and electrically interconnected to electrical conductors on the substrate, with electrical conductors on the substrate interconnected to said pattern of electrical conductors on said first PWB, e. a plurality of solder or conductive adhesive bonding means on the top surface of said first PWB, said bonding means interconnected to said pattern of electrical conductors on the top surface of the said first PWB, f. a second PWB having at least one aperture extending from the top surface of said second PWB through the thickness of said second PWB to the bottom surface of said second PWB, said second PWB being bonded to said first PWB by said bonding means, and positioned so that the portion of said multi-chip module tile fits at least partially within the aperture in the second PWB, g. encapsulation means comprising an encapsulating material encompassing the multi-chip module tile, and the electrical conductors interconnecting the silicon chip to the substrate and the substrate to the first PWB.

2. The MCM package of claim 1, in which said first PWB is a single level PWB, the aperture extends through the PWB a dam is on an upper surface of said first PWB, the dam is spaced a distance from an edge of the aperture sufficiently to permit a wirebond connection between the circuitry on the silicon substrate of the MCM tile and the circuitry on said first PWB, and said at least one chip is within a cavity formed by the structural member, walls of the aperture in said first PWB and the dam, said structural member being a heat sink.

3. The MCM package of claim 1, in which said substrate comprises silicon.

4. The MCM package of claim 1, in which said at least one silicon chip is flip-chip mounted on the substrate.

5. The MCM package of claim 1, in which said structural member is of a heat conducting material, and provides a heat sink for the substrate.

\* \* \* \* \*